US005917232A

United States Patent [19]

[11] Patent Number: 5,917,232

Tanizaki et al.

[45] Date of Patent: Jun. 29, 1999

[54] DIELECTRIC-LINE INTEGRATED CIRCUIT

[75] Inventors: Toru Tanizaki, Kyoto; Yoshinori Taguchi, Kuse-gun, both of Japan

[73] Assignee: Murata Manufacturing Co., Ltd., Japan

[21] Appl. No.: 08/889,870

[22] Filed: Jul. 8, 1997

[30] Foreign Application Priority Data

Jul. 8, 1996 [JP] Japan .................................... 8-177731

[51] Int. Cl.[6] ............................... H01L 29/40; H01P 5/00

[52] U.S. Cl. .......................... 257/664; 333/113; 333/248; 333/254

[58] Field of Search ..................................... 333/254, 248, 333/239, 113, 1.1, 246, 260; 257/664, 752

[56] References Cited

U.S. PATENT DOCUMENTS

| | | | |
|---|---|---|---|
| 3,577,105 | 5/1971 | Jones, Jr. | 333/95 |
| 5,724,013 | 3/1998 | Ishikawa et al. | 333/254 |

FOREIGN PATENT DOCUMENTS

| | | |
|---|---|---|
| 0699915 | 3/1996 | European Pat. Off. . |
| 0700112 | 3/1996 | European Pat. Off. . |
| 2275826 | 9/1994 | United Kingdom . |

OTHER PUBLICATIONS

Patent Abstracts of Japan, vol. 18, No. 270 (E–1552), May 23, 1994 & JP 06 045808 A (Honda Motor Col Ltd), Feb. 18, 1994, abstract.

*Primary Examiner*—Minh Loan Tran
*Attorney, Agent, or Firm*—Ostrolenk, Faber, Gerb & Soffen, LLP

[57] ABSTRACT

A dielectric-line component (such as an oscillator or circulator) has a dielectric strip between a pair of electrically conductive flat-plates. The component is to be combined with another dielectric-line component which also has dielectric strips between a pair of conductive plates. When these components are assembled, a pair of conductive plates of the respective two components opposedly face each other at a first position, while the other pair of conductive plates of the respective two components opposedly face each other at a second position. The first and second positions are displaced from each other in the vertical direction and in the length direction in relation to the conductive plates. Further, the opposing faces of the dielectric strips of the two components are positioned in an area defined by the first and second positions, either between the first and second positions or at one of the first and second positions, for example. Thus, the overall opposing faces of the two components are formed in a step-like shape. Accordingly, easy and correct vertical and lengthwise positioning of the dielectric strips is achieved. Further, the configuration of the end faces of the conductive plates of the dielectric-line components can be determined independently of the configuration of the dielectric strips. As a consequence, mass production can be enhanced to achieve a reduction in cost.

6 Claims, 11 Drawing Sheets

DIELECTRIC-LINE INTEGRATED CIRCUIT

BACKGROUND OF THE INVENTION

1. Field of the Invention

The present invention relates to a dielectric-line integrated circuit formed by a combination of dielectric-line components, each having a dielectric strip between two electrically conductive flat-plates located substantially parallel to each other.

2. Description of the Related Art

An application of the above type of dielectric-line integrated circuit, for example, is a vehicle-mounted millimeter-wave radar using dielectric lines, which is formed by a combination of various types of dielectric-line components, such as an oscillator, a circulator, and a mixer.

Two examples of conventional vehicle-mounted millimeter-wave radar are shown in FIGS. 14 and 15. In FIG. 14, the radar includes electrically conductive flat-plates 1*a* and 2*a*, which also serve as the radar body, i.e., a casing for dielectric-line components. Hollows indicated by H1, H2 and H3 are formed on the opposing surfaces of the conductive plates 1*a* and 2*a*. Reference numerals 10 and 11 respectively indicate an oscillator and a circulator which are respectively fit into the hollows H1 and H2. A mixer (not shown) is fit into the hollow H3. Disposed between the conductive plates 1*a* and 2*a* are dielectric strips 6, 7 and 8 and terminating devices 9 and 12. With this arrangement, in operation, an oscillation signal output from the oscillator 10 passes through one port of the circulator 11 and the dielectric strip 6, and radiates from a horn 13 to the exterior. Conversely, electromagnetic waves propagating via the dielectric strip 6 in the direction opposite to the transmitting direction of the oscillation signal do not return to the oscillator 10 but are transmitted to the terminating device 12 connected to another port of the circulator 11. Waves reflected from a subject are received by a horn 14 and input into the mixer via the dielectric strip 8. A coupler is interposed between the dielectric strips 6 and 7 and between the dielectric strips 7 and 8, whereby reflection signal indicating the waves reflected from the subject and a local signal are both input into the mixer.

In another example of the dielectric-line integrated circuit shown in FIG. 15, apertures A1, A2 and A3 are formed on the upper conductive plate 2*a*, so that the oscillator 10, the circulator 11, and a mixer (unillustrated) can be respectively fit into the apertures A1, A2 and A3 from the exterior in the state in which the two conductive plates 1*a* and 2*a* are assembled. The other details of this example are similar to the example illustrated in FIG. 14.

In the dielectric-line integrated circuits shown in FIGS. 14 and 15, the characteristics of the individual dielectric-line components, such as an oscillator and a circulator, can be singly measured and calibrated, and then, the dielectric-line components can be attached to the radar body (i.e., the conductive plates), thereby constructing a single dielectric-line integrated circuit. This type of integrated circuit is more advantageous over a dielectric-line integrated circuit of the type in which all of the dielectric lines are formed between two conductive plates, because the evaluation and adjustment of the overall characteristics can be made simple, and the individual dielectric-line components can be formed into modules.

However, the following problem is encountered in aligning the dielectric strips formed in a plurality of dielectric-line components when the components are assembled and integrated into a single circuit. More specifically, referring to FIG. 14, the dimensions of the dielectric-line components are determined so that the heights of the two dielectric strips can be equal to each other in the state in which the bottom surface of the component is placed on the bottom surface of the hollow formed in the dielectric-line body. The dimensional precision of the respective components should be extremely high, in order to avoid changing the characteristics of the components due to a displacement of the dielectric strips.

Moreover, in known dielectric-line components, for example, in a circulator, upper and lower dielectric plates 2*b* and 1*b* are configured, as illustrated in FIG. 16, to match the end faces of three-port dielectric strips, thereby inevitably forming the overall circulator generally in a regular triangle shape, and forming the mating hollows and apertures of the dielectric-line body in the same shape as well. However, conductive plates having such flat end faces or having hollows and apertures with internal flat surfaces are difficult to fabricate and also occupy a large area of a resulting dielectric-line integrated circuit. In contrast, the end faces of dielectric strips are desirably flat to be easily manufactured. Thus, for example, if the shape of a dielectric strip 3*b* remains unchanged (i.e., flat), and the upper and lower conductive plates 1*b* and 2*b* are formed in a disc-like shape, the following inconveniences are generated. If the end face of the dielectric strip 3*b* disposed in the circulator is located not to project from the end face of the conductive plate, as illustrated in FIG. 17A, a clearance is disadvantageously formed between the end face of the dielectric strip 3*b* and the end face of a mating dielectric strip 3*a*. Conversely, if the end face of the dielectric strip 3*b* formed in the circulator projects to reach the end face of the mating dielectric strip 3*a*, as shown in FIG. 17B, the dielectric-line component having the dielectric strip 3*b* is too tight to fit into the aperture A2 shown in FIG. 15, since the edge of the strip 3*b* tightly hits the internal surface of the aperture A2. Or, the component having the dielectric strip 3*b* is forced into the aperture A2, resulting in damaging the edge of the dielectric strip 3*b*.

SUMMARY OF THE INVENTION

Accordingly, a feature of the present invention is to provide a dielectric-line integrated circuit which exhibits stable characteristics by making possible the easy and correct alignment of dielectric strips used in the dielectric-line integrated circuit.

Another feature of the present invention is to provide a dielectric-line integrated circuit in which mass production is enhanced to achieve a reduction in cost by making it possible to separately determine the configuration of end faces of electrically conductive flat-plates used in dielectric-line components and the configuration of end faces of dielectric strips used in the components.

In order to provide the above features, according to a broad aspect of present invention, there is provided a dielectric-line integrated circuit comprising a plurality of dielectric-line components, each including two electrically conductive flat-plates located substantially parallel to each other and a dielectric strip interposed between the conductive plates, wherein a first one of the two conductive plates provided for one dielectric-line component and a corresponding first one of the two conductive plates provided for another dielectric-line component opposedly face each other at a first position, while the other second conductive plates of said dielectric-line components opposedly face each other at a second position, the first and second positions being displaced from each other in a length direction of said dielectric-line components, and wherein respective ends of the dielectric strips of said dielectric-line components opposedly face each other at a position in an area defined by the first and second positions.

Said respective ends of said dielectric strips may face each other at or between said first and second positions.

In the foregoing dielectric-line integrated circuit, grooves may be respectively formed in the conductive plates, and the dielectric strips may be fit into the grooves.

Further, engaging portions may be formed at end faces of the dielectric strips of the two dielectric-line components so that the dielectric strips may be engaged with each other.

These and other objects, features and advantages of the invention will become more apparent by referring to the following detailed description in connection with the accompanying drawings.

BRIEF DESCRIPTION OF THE DRAWINGS

FIG. 2A illustrates the dielectric-line components before assembly; and FIG. 2B illustrates the dielectric-line components after assembly;

FIG. 4A illustrates the dielectric-line components before assembly; and FIG. 4B illustrates the dielectric-line components after assembly;

FIG. 6A illustrates the dielectric-line components before assembly; and FIG. 6B illustrates the dielectric-line components after assembly;

DESCRIPTION OF EMBODIMENTS OF THE INVENTION

Figure 1:
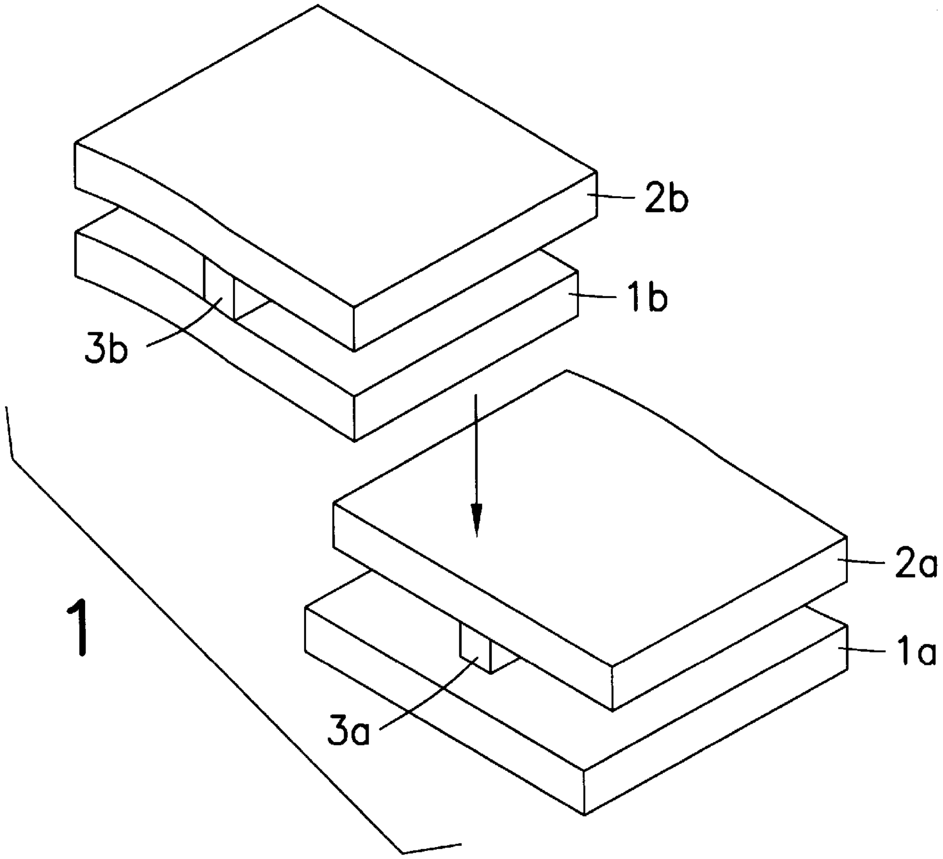
FIG. 1 is a partial perspective view illustrating a first example of two dielectric-line components used in a dielectric-line integrated circuit.
Figure 2A:
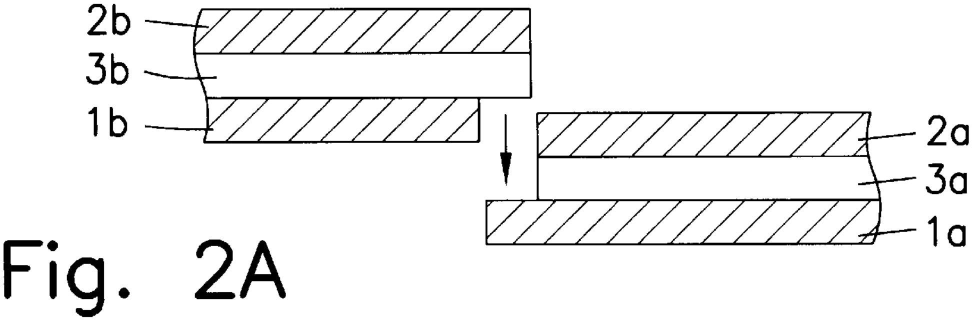
FIGS. 2A and 2B are sectional views of the two dielectric-line components shown in FIG. 1.
Figure 2B:
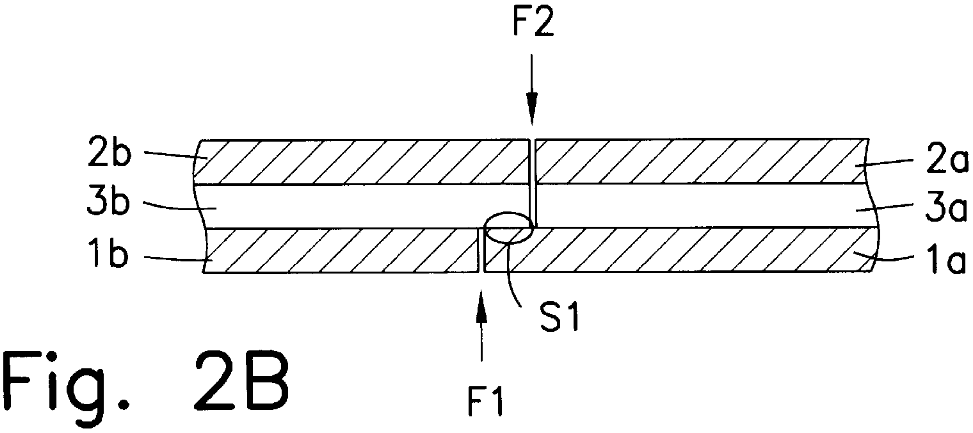

The above-mentioned broad aspect of the present invention can be implemented by the following example. It will now be assumed that two dielectric-line components illustrated in FIG. 1 are being combined with each other. One dielectric-line component is formed by disposing a dielectric strip 3*a* between two electrically conductive flat-plates 1*a* and 2*a* which are located parallel to each other, while the other component is formed by providing a dielectric strip 3*b* between two electrically conductive flat-plates 1*b* and 2*b* which are positioned parallel to each other. FIG. 2A illustrates the components shown in FIG. 1 before they are combined; and FIG. 2B illustrates the components after they are combined. FIG. 2B reveals that one pair of conductive plates 1*a* and 1*b* of the respective components opposedly face each other at a facing position F1, while the other pair of conductive plates 2*a* and 2*b* opposedly face each other at a facing position F2, the facing positions F1 and F2 being displaced from each other in the vertical direction and the length direction in relation to the conductive plates. In this example, the opposing faces of the dielectric strips 3*a* and 3*b* are located at the position F2. In this manner, the two dielectric-line components are assembled so that the opposing faces of the components are formed in a step-like shape. Accordingly, the conductive plate 1*a* and the dielectric strip 3*b* abut against each other at a section indicated by S1. This makes it possible to correctly position the dielectric strips 3*a* and 3*b* in the vertical direction (i.e., in a direction along the height of the strips 3*a* and 3*b* in FIG. 2B) as well as the length direction, in relation to the conductive plates.

Figure 3:
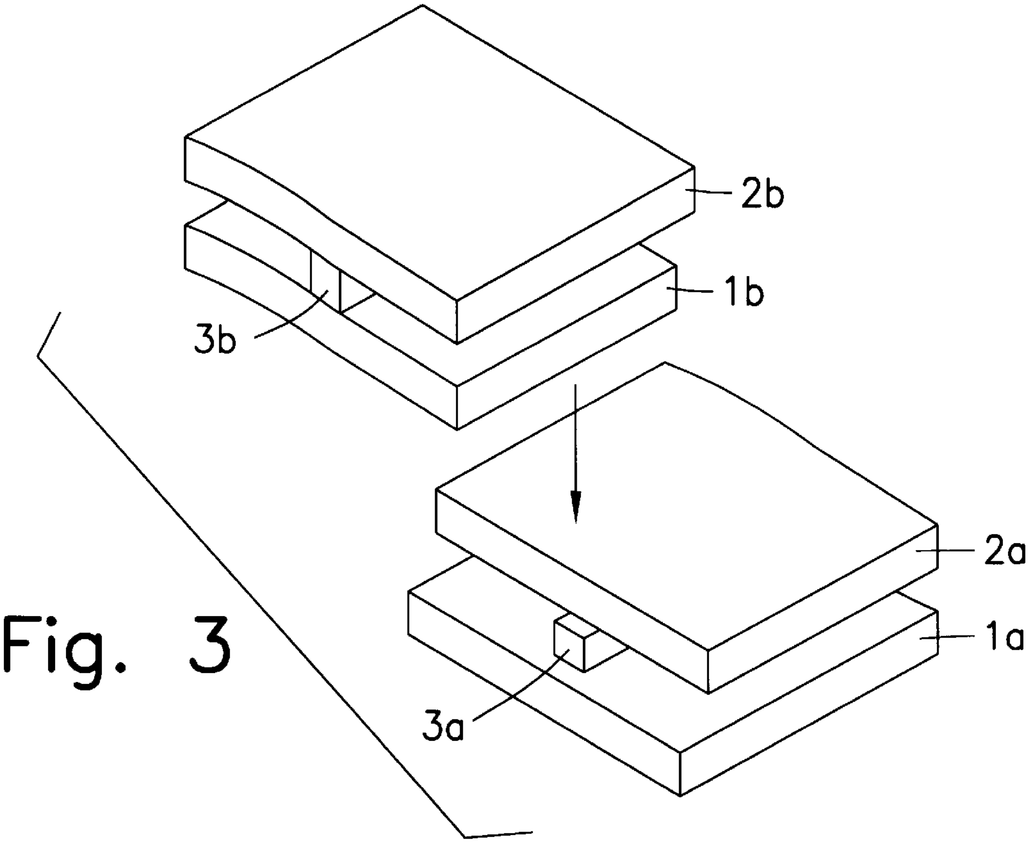
FIG. 3 is a partial perspective view illustrating a second example of two dielectric-line components.
Figure 4A:
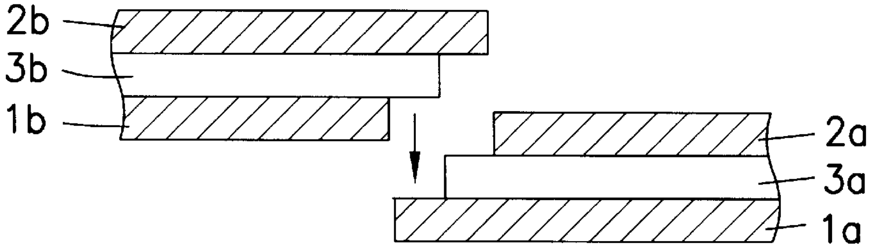
FIGS. 4A and 4B are sectional views of the dielectric-line components shown in FIG. 3.
Figure 4B:
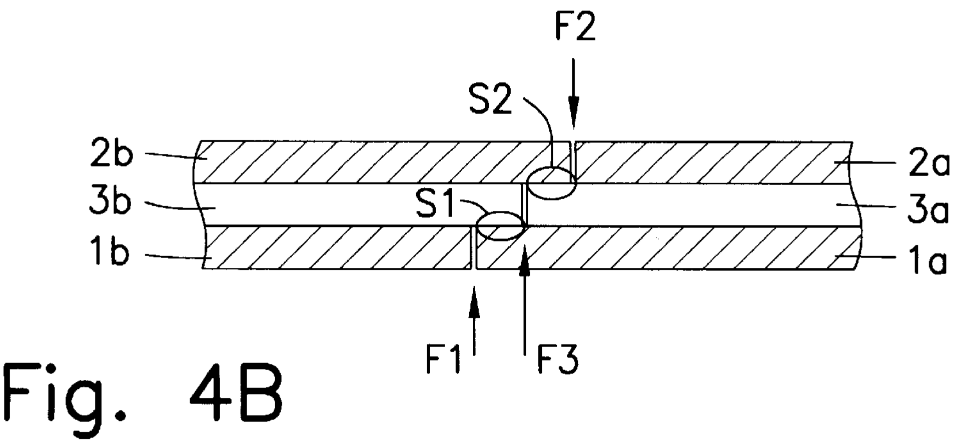

In the example of the dielectric-line components shown in FIGS. 3, 4A and 4B, a pair of dielectric plates 1*a* and 1*b* of the respective components opposedly face each other at a facing position F1, while the other pair of dielectric plates 2*a* and 2*b* opposedly face each other at a facing position F2. Further, in this example, the position at which the dielectric strips 3*a* and 3*b* opposedly face each other is determined to be a facing position F3, which is a middle point interposed in the length direction between the facing positions F1 and F2. In this manner, the two dielectric-line components are assembled so that the opposing faces of the components are formed in a step-like shape. Accordingly, the conductive plate 1*a* and the dielectric strip 3*b* abut against each other at a section indicated by S1, while the conductive plate 2*b* and the dielectric strip 3*a* abut against each other at a section indicated by S2. As a result, accurate positioning of the dielectric strips 3*a* and 3*b* in the vertical direction in relation to the conductive plates can be performed.

Figure 5:
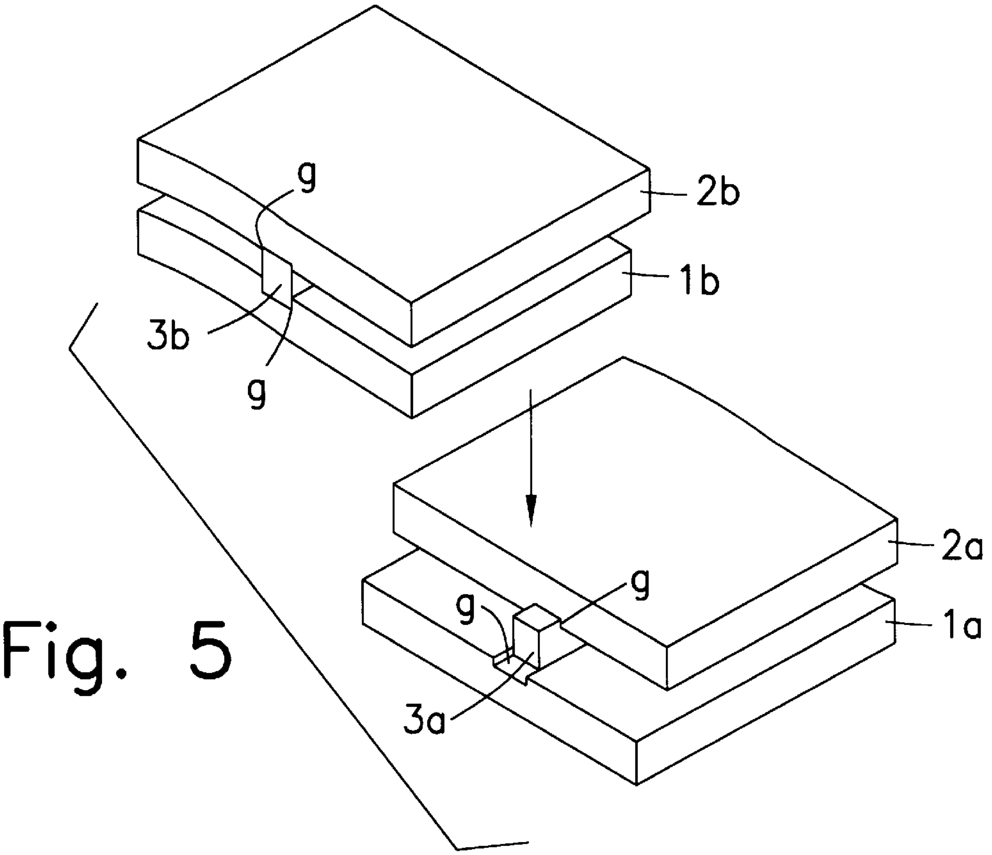
FIG. 5 is a partial perspective view illustrating a third example of two dielectric-line components.
Figure 6A:
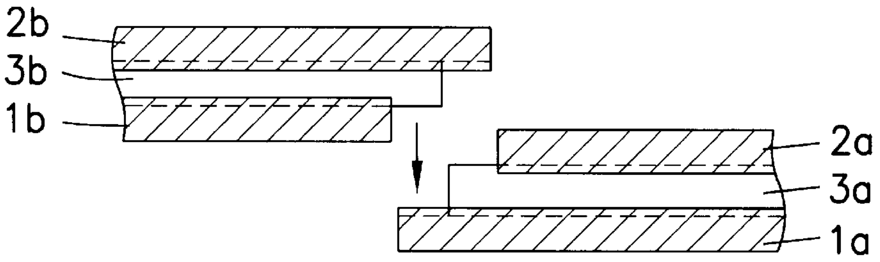
FIGS. 6A and 6B are sectional views of the dielectric-line components shown in FIG. 5.
Figure 6B:
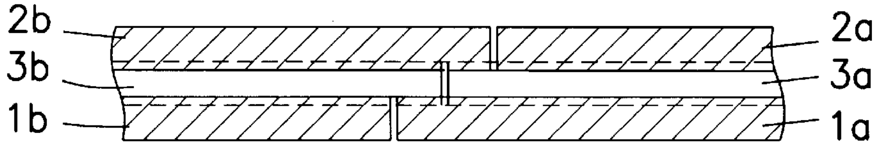

Further, the foregoing dielectric-line integrated circuit may be modified in the following manner. The conductive plates shown in FIGS. 1 through 4B are grooved, and the dielectric strips are fit into the grooves. For example, as shown in FIG. 5, grooves g, g are respectively formed on the internal surfaces of the conductive plates 1*a* and 2*a*, into which the dielectric strip 3*a* is fit. Moreover, grooves g, g are formed on the internal surfaces of the conductive plates 1*b* and 2*b*, into which the dielectric strip 3*b* is inserted. When the two dielectric-line components are assembled, as indicated in the sectional view of FIGS. 6A and 6B, the dielectric strip 3*b* is fit into the groove g formed in the conductive plate 1*a*, while the groove g formed in the conductive plate 2*b* covers part of the dielectric strip 3*a*. With this arrangement as well, the dielectric strips 3*a* and 3*b* can be correctly located in a direction parallel to the conductive plates and perpendicular to the direction in which electromagnetic waves propagate in the dielectric strips 3*a* and 3*b*, as well as in the vertical direction in relation to the conductive plates.

Figure 7A:
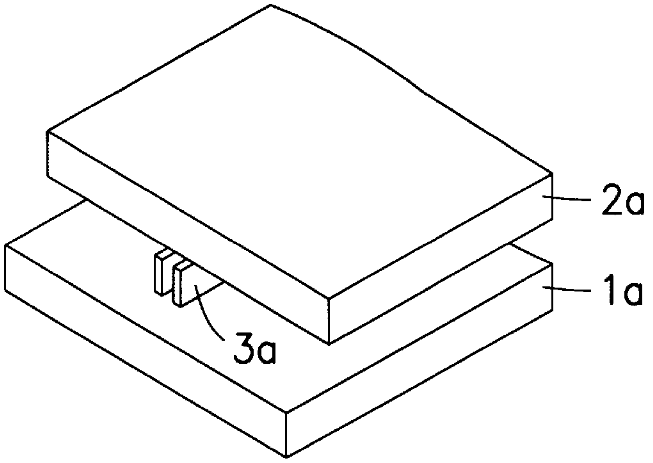
FIG. 7A is a partial perspective view of a modified dielectric-line component used in a dielectric-line integrated circuit.
Figure 7B:
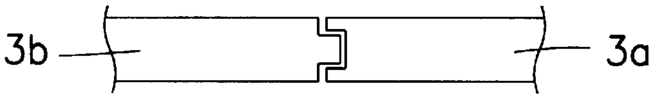
FIG. 7B is a fragmentary plan view of a dielectric strip used in the dielectric-line component shown in FIG. 7A.

Moreover, respective engaging portions may be provided on their opposing end faces for the engagement of the two dielectric strips. For example, as illustrated in FIG. 7A and 7B, a recessed engaging portion is formed at the end face of the dielectric strip 3*a*, while a projecting engaging portion is formed at the end face of the mating dielectric strip 3*b*. Thus, the dielectric strips 3*a* and 3*b* can be engaged with each other, as is seen from the plan view of FIG. 7B. It is thus possible to correctly position the dielectric strips 3*a* and 3*b* in a direction parallel to the conductive plates and perpendicular to the direction in which electromagnetic waves propagate in the dielectric strips 3*a* and 3*b*, as well as in the vertical direction to the conductive plates.

The shapes of the foregoing pair of engaging portions are not restricted to a recess and a projection.

Figure 8A:
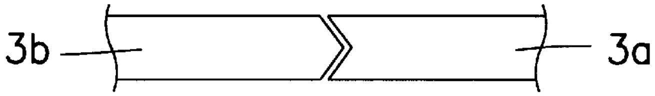
FIGS. 8A and 8B are fragmentary plan views illustrating various configurations of the end faces of other modified dielectric strips used in a dielectric-line integrated circuit.
Figure 8B:
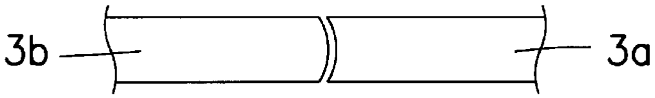

A pair of engaging portions may be configured, as shown in FIG. 8A, as a wedge or "V" shape, or may be curved, as illustrated in FIG. 8B, for example.

A dielectric-line integrated circuit constructed in accordance with a first embodiment of the present invention will now be described while referring to FIGS. 9A and 9B.

Figure 9A:
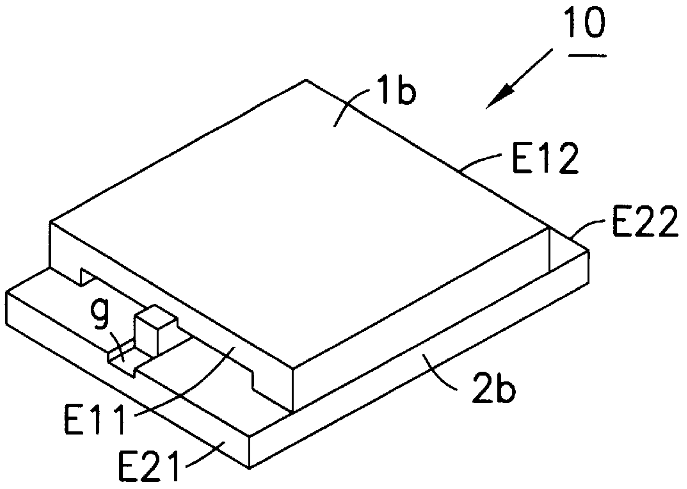
FIGS. 9A and 9B are perspective views illustrating a dielectric-line integrated circuit according to a first embodiment of the present invention.
Figure 9B:
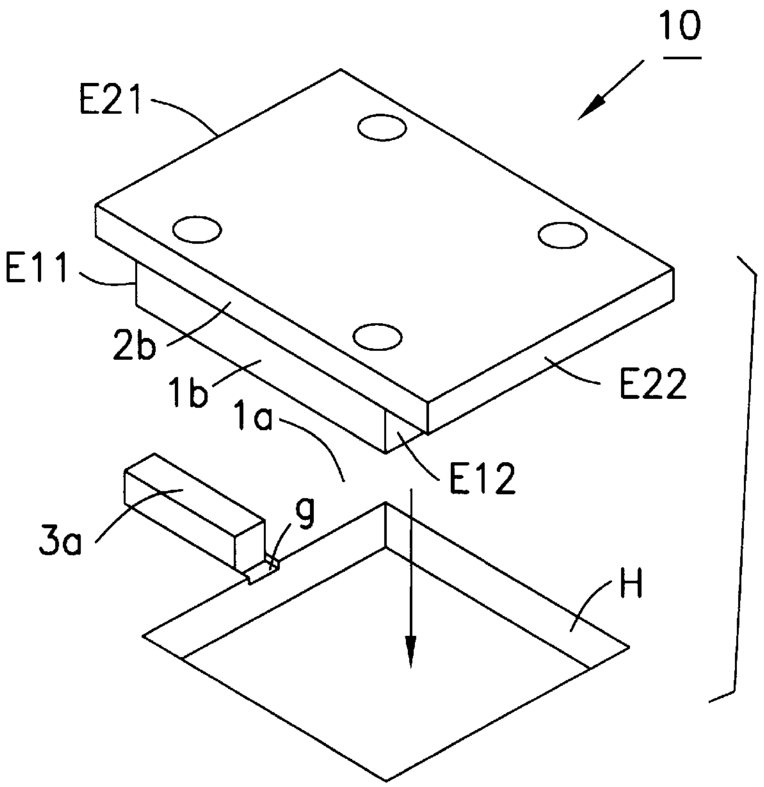
Figure 14:
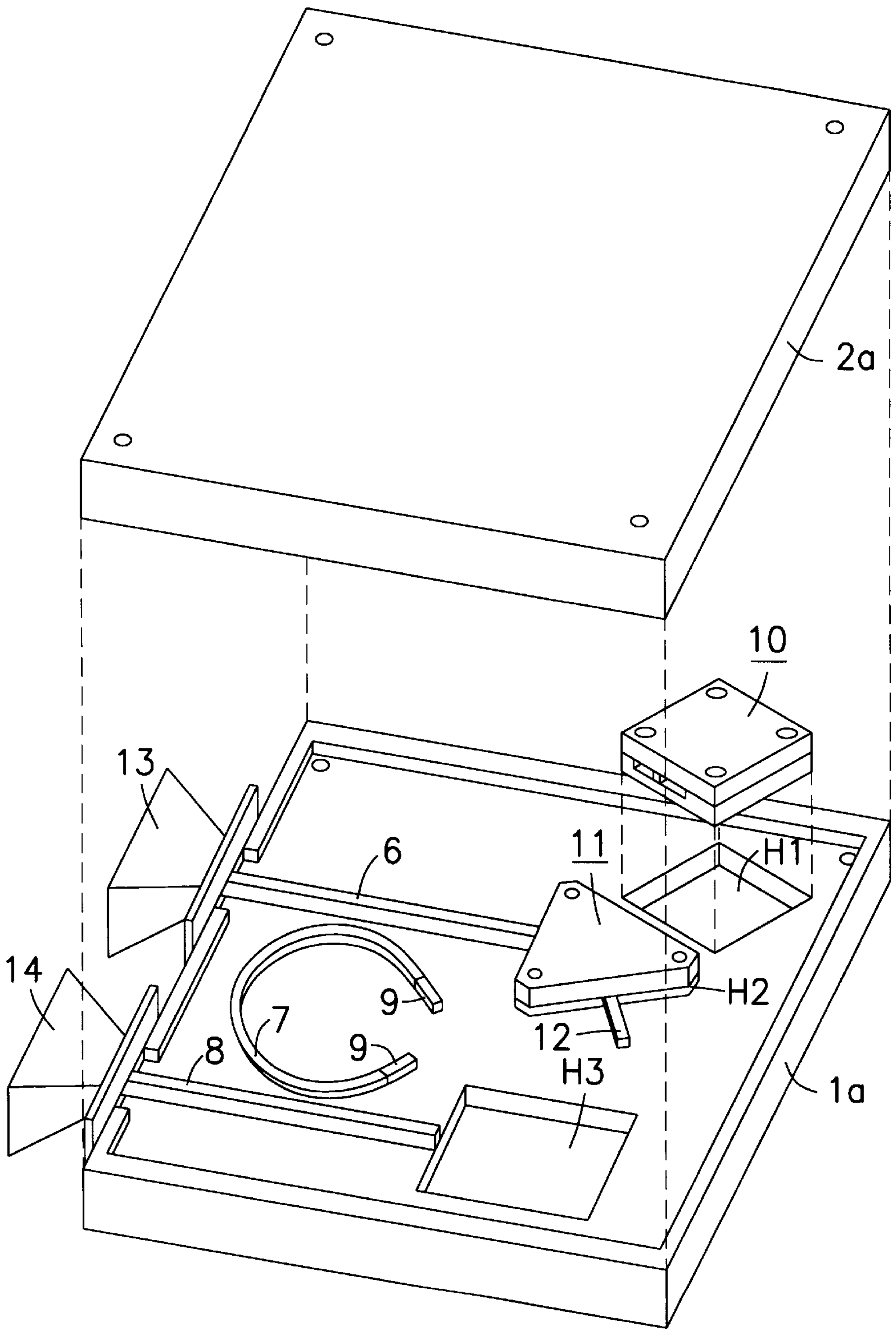
Fig. 14 PRIOR ART
FIG. 14 is an exploded perspective view illustrating an example of a conventional dielectric-line integrated circuit.
Figure 15:
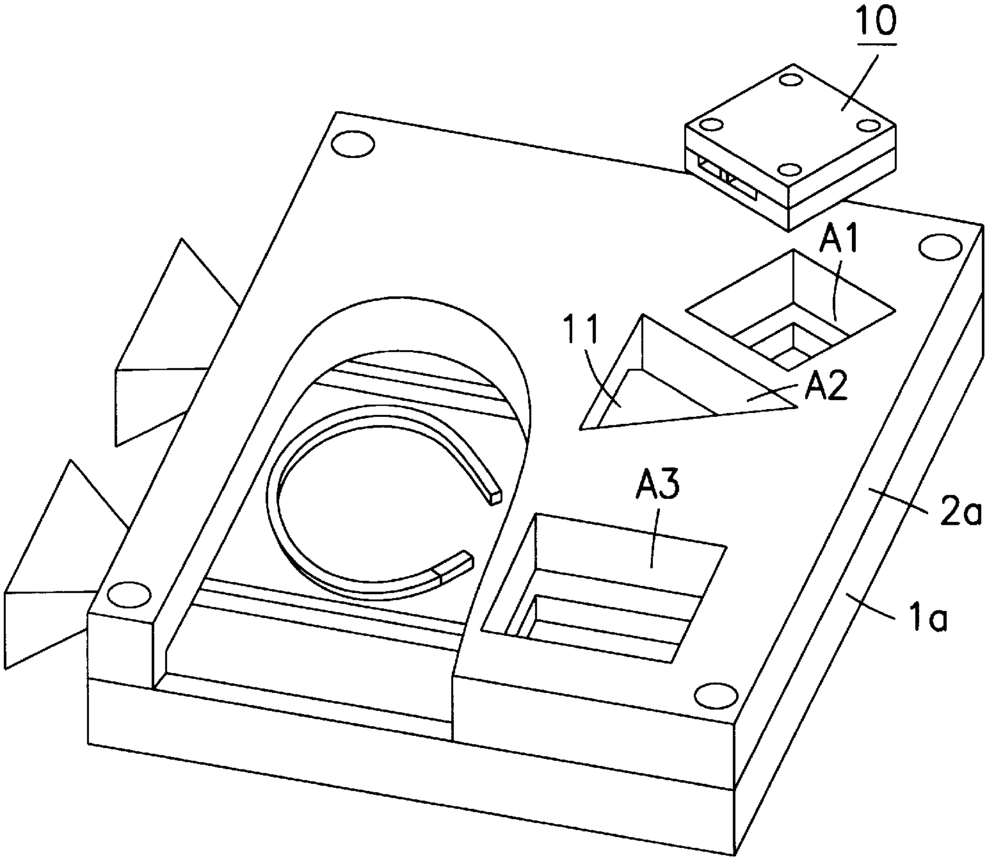
Fig. 15 PRIOR ART
FIG. 15 is a perspective view cutaway in part illustrating another example of conventional dielectric-line integrated circuits.
Figure 16:
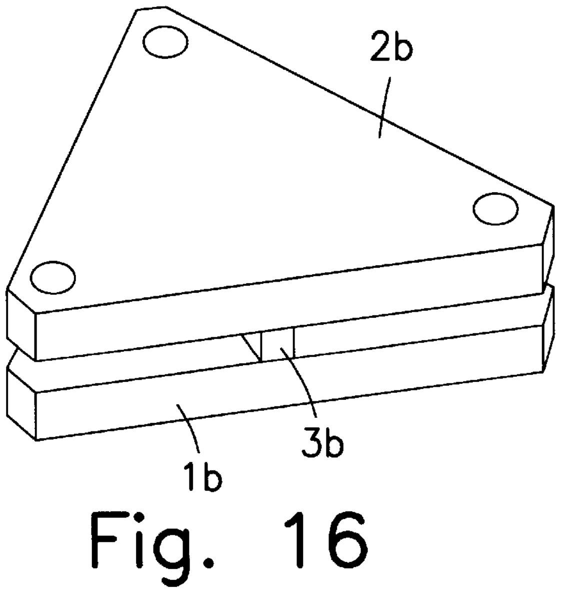
Fig. 16 PRIOR ART
FIG. 16 is a perspective view illustrating a conventional circulator.
Figure 17A:
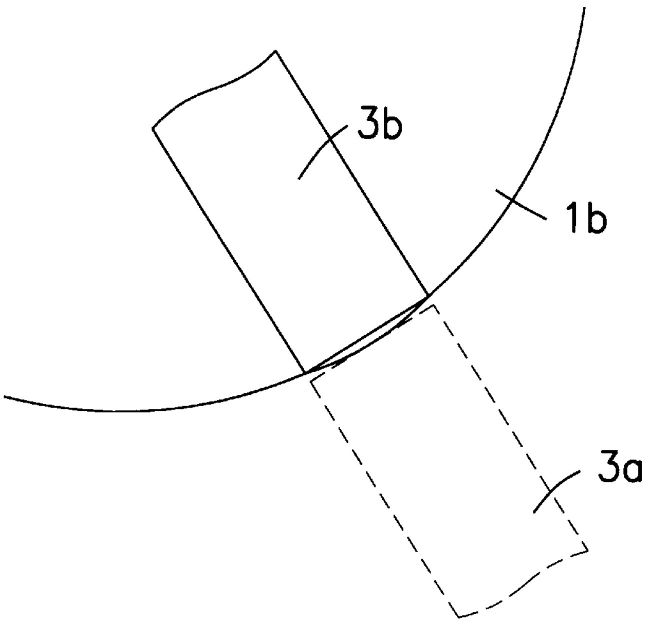
FIGS. 17A and 17B illustrate the configurations of end faces of a conventional conductive plate and a dielectric strip.
Figure 17B:
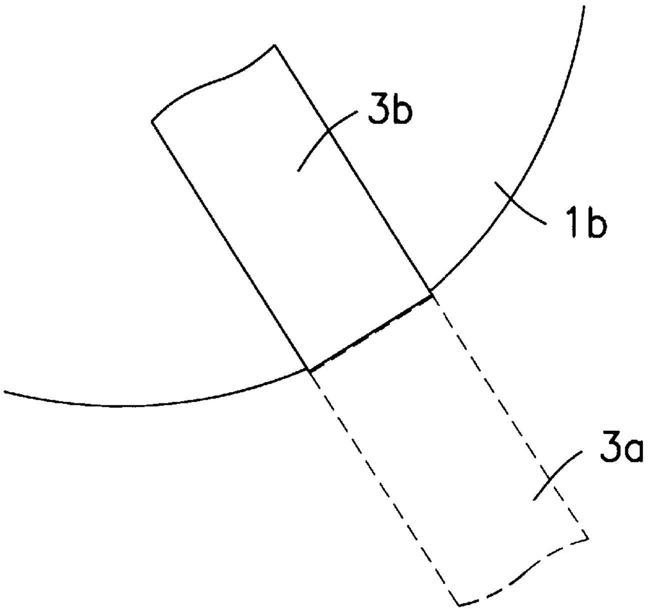

The oscillator shown in FIG. 9A can be substituted for, for example, the oscillator 10 illustrated in FIG. 14. In this oscillator, which is also designated by 10, grooves g are respectively formed in the internal surfaces of the upper and lower electrically conductive flat-plates 1*b* and 2*b* which are disposed parallel to each other. A dielectric strip 3*b* is located between the conductive plates 1*b* and 2*b*, and certain circuits are also formed therebetween. Two end faces E21 and E22 of the conductive plate 2*b* respectively project farther than two end faces E11 and E12 of the conductive plate 1*b*, and an end face of the dielectric strip 3*b* is positioned at a middle point between the end faces E11 and E21 of the conductive plates 1*b* and 2*b*. The above-described oscillator 10, which is used as a dielectric-line component, is turned upside down and fits into a hollow H formed in a mating dielectric-line component, as shown in FIG. 9B. A dielectric strip 3*a* is provided on the mating dielectric-line component in which the hollow H is formed, and the end face of the strip 3*a* is located at a position farther inward from the end face (internal wall) of the hollow H (in other words, at a position farther outward, as viewed from the hollow H). The foregoing oscillator 10 is placed in the hollow H formed in the conductive plate 1*a*, so that the lower conductive plate 1*b* of the oscillator 10 fits into the hollow H, and the end face of the dielectric strip 3*b* fits into the groove g of the conductive plate 1*a*. Further, the groove g formed in the conductive plate 2*b* covers part of the dielectric strip 3*a*. With this arrangement, the dielectric strips 3*a* and 3*b* are positioned both in the vertical and horizontal directions in relation to the conductive plates.

An explanation will now be given of a dielectric-line integrated circuit constructed in accordance with a second embodiment of the present invention while referring to FIGS. 10A through 13B.

Figure 10A:
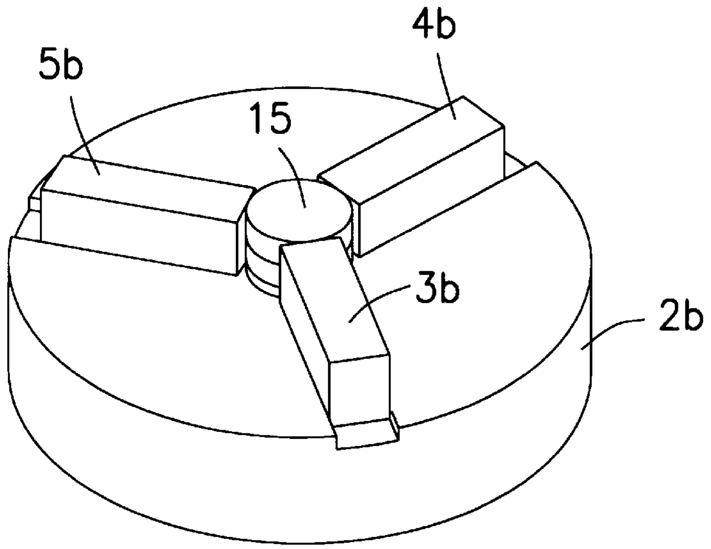
FIGS. 10A and 10B are perspective views illustrating a circulator used in a dielectric-line integrated circuit according to a second embodiment of the present invention.
Figure 10B:
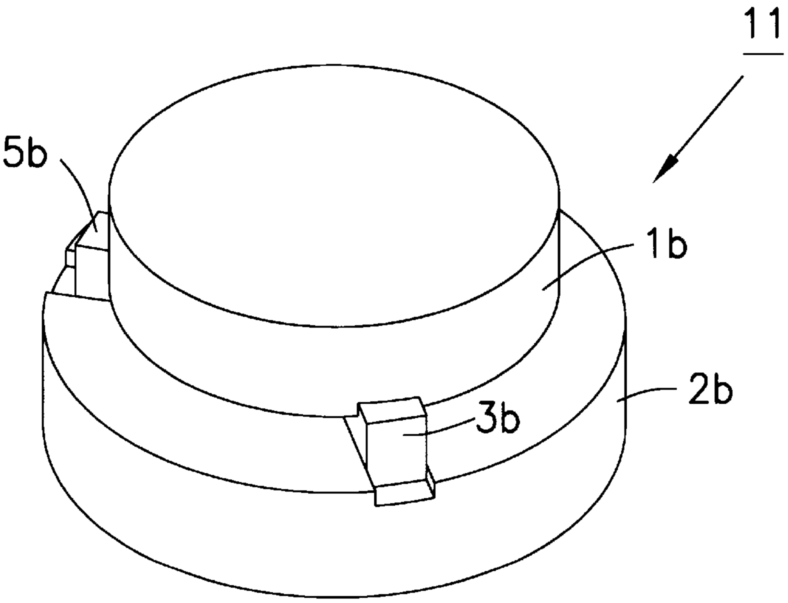

FIG. 10A is a perspective view of a circulator without its upper electrically conductive flat-plate 1*b*; FIG. 10B illustrates the circulator 11 with its upper electrically conductive flat-plate 1*b*. Upper and lower conductive plates 1*b* and 2*b* are aluminum disc-like plates. Formed in the internal surface of each of the conductive plates 1*b* and 2*b* are three grooves into which dielectric strips 3*b*, 4*b* and 2*b* are inserted. Further, two upper and lower ferrite plates 15 are disposed at the center of the disc-like plates 1*b* and 2*b*. The external diameter of the lower conductive plate 2*b* is set to be greater than that of the upper conductive plate 1*b*, and the end faces of the three dielectric strips 3*b*, 4*b* and 5*b* are each positioned at a midpoint between the end faces of the conductive plates 1*b* and 2*b*.

Figure 11:
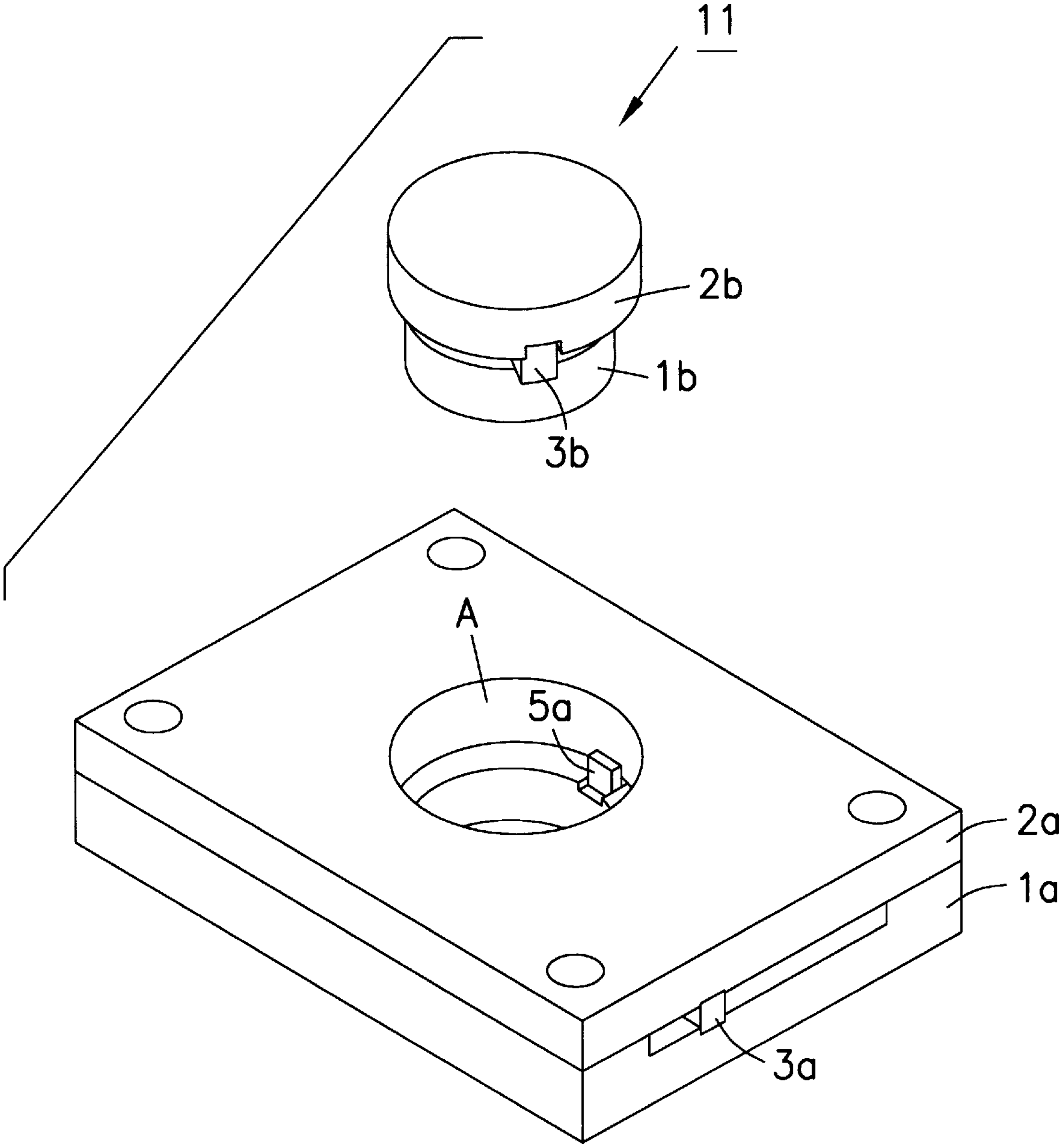
FIG. 11 is a perspective view illustrating the circulator shown in FIG. 10 being fit into another dielectric-line component.

FIG. 11 is a perspective view illustrating the circulator shown in FIGS. 10A arid 10B to be inserted into a mating dielectric-line component. The mating dielectric-line component provided for the dielectric-line body has dielectric strips 3*a* and 5*a* formed between the conductive plates 1*a* and 2*a*, and an aperture is formed in each of the conductive plates 1*a* and 2*a*. The internal diameters of the apertures are formed to be slightly larger than the external diameters of the conductive plates 1*b* and 2*b* of the circulator 11. With this arrangement, the circulator 11 is fit into the aperture, so that the end face of the dielectric strip 5*b* illustrated in FIGS. 10A and 10B opposedly faces the end face of the dielectric strip 5*a* provided for the dielectric-line body without substantially producing a clearance therebetween.

Figure 12A:
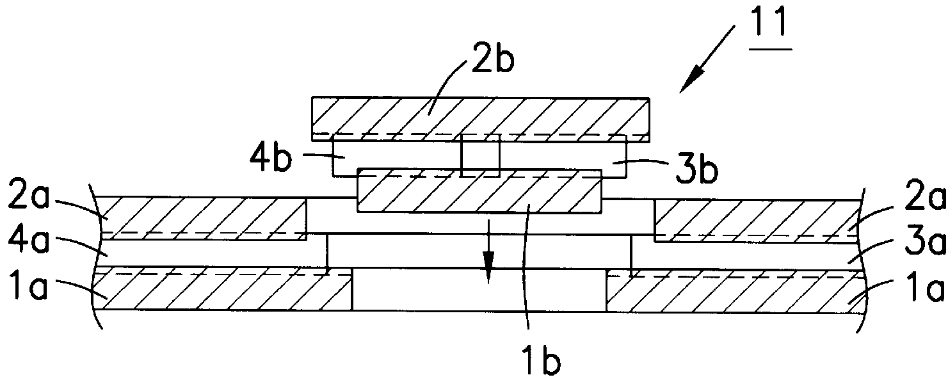
FIGS. 12A and 12B are sectional views illustrating the dielectric-line integrated circuit shown in FIG. 11.
Figure 12B:
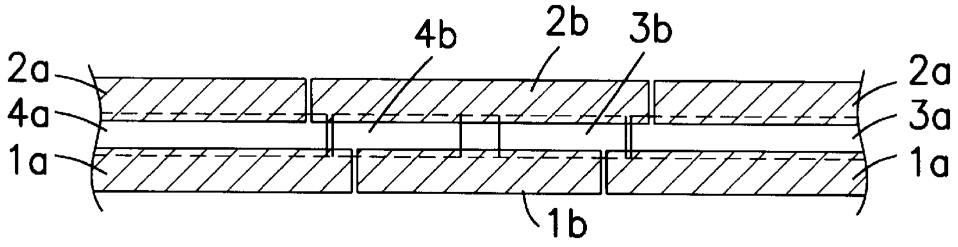

FIG. 12A is a sectional view of the dielectric-line integrated circuit shown in FIG. 11 before the circulator is attached to a mating dielectric-line component; and FIG. 12B illustrates the integrated circuit after the circulator is attached to the mating component. FIG. 12B shows that the edge portions of the dielectric strips 4*b* and 3*b* formed in the circulator 11 fit into the groove formed in the conductive plate 1*a* of the dielectric-line body, and that the grooves of the conductive plate 2*b* of the circulator accommodate the top surfaces of part of the dielectric strips 4*a* and 3*a* formed on the dielectric-line body. Thus, the dielectric strips 4*b* and 3*b* of the circulator 11 can be respectively aligned with the dielectric strips 4*a* and 3*a* both in the vertical direction in relation to the conductive plates and in the direction of planar rotation.

Figure 13A:
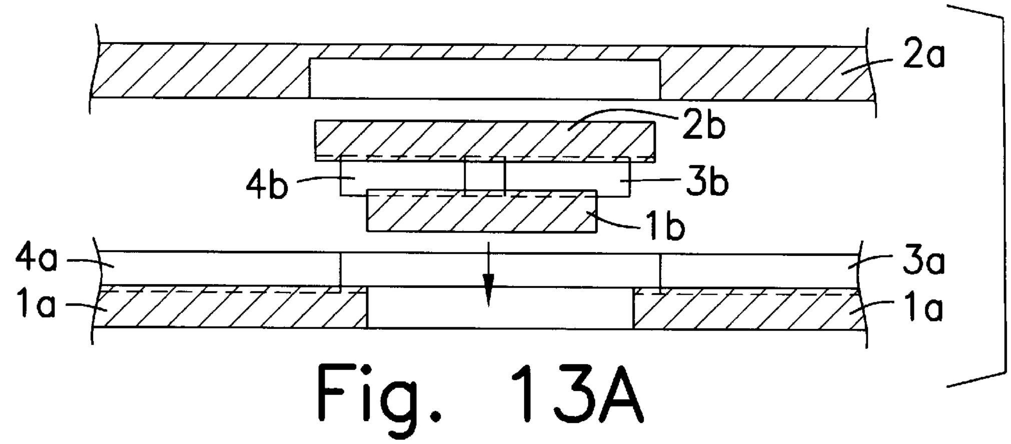
FIGS. 13A and 13B are sectional views illustrating a modification made to the dielectric-line integrated circuit shown in FIGS. 11 and 12.
Figure 13B:
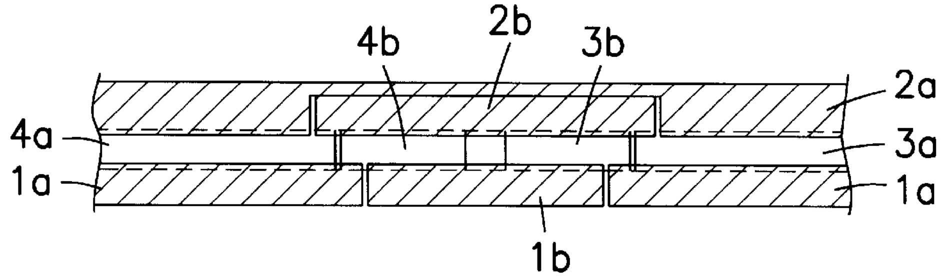

FIGS. 13A and 13B are sectional views illustrating a modification made to the dielectric-line integrated circuit shown in FIGS. 12A and 12B. In this modification, unlike the configuration of the circuit shown in FIGS. 12A and 12B, the circulator 11 is fit into the lower conductive plate 1*a*, and then, the upper conductive plate 2*a* covers the lower plate 1*b* to complete an assembly.

As has been discussed in the second embodiment, the dielectric plates of a dielectric-line component to be inserted into the dielectric-line body can be formed in a disc-like shape, and mating hollows or apertures formed in the dielectric-line body to receive the above component can also be formed to be circular. Thus, the conductive plates and hollows or apertures can be readily formed by means such as milling.

What is claimed is:

1. A dielectric-line integrated circuit comprising a plurality of dielectric-line components, each including two electrically conductive flat-plates located substantially parallel to each other and a dielectric strip interposed between said electrically conductive flat-plates, wherein a first one of the two electrically conductive flat-plates provided for one dielectric-line component and a corresponding first one of the two electrically conductive flat-plates provided for another dielectric-line component opposedly face each other at a first junction, while the respective second electrically conductive flat-plates of the dielectric-line components opposedly face each other at a second junction, a first corner being defined by said first junction and an upper surface of said dielectric strip, and a second corner being defined by said second junction and a lower surface of said dielectric strip;

said first and second corners being displaced from each other in a length direction along said dielectric-line components, and wherein respective ends of the dielectric strips of the dielectric-line components opposedly face each other at a position in an area defined by said first and second junctions.

2. A dielectric-line integrated circuit according to claim 1, wherein respective grooves are formed in said electrically conductive flat-plates, and said dielectric strips corresponding respectively to said flat-plates are fit into said grooves.

3. A dielectric-line integrated circuit according to claim 1, wherein engaging portions are formed at respective end faces of the dielectric strips of said two dielectric-line components so that said dielectric strips are engageable with each other.

4. A dielectric-line integrated circuit according to claim 1, wherein said respective ends of said dielectric strips opposedly face each other at one of said first and second junctions.

5. A dielectric-line integrated circuit according to claim 1, wherein said respective ends of said dielectric strips opposedly face each other at a position between said first and second junctions.

6. A dielectric-line integrated circuit according to claim 1, wherein said first and second junctions and said dielectric strip have respective cross-sectional shapes, and one of said first and second junctions has a different cross-sectional shape than said dielectric strip.

* * * * *